United States Patent [19]
Barker et al.

[11] Patent Number: 5,478,445
[45] Date of Patent: Dec. 26, 1995

[54] ELECTROCHEMICAL PROCESS

[75] Inventors: Jeremy Barker, San Jose, Calif.; Rodney J. Marshall, Southampton; Mehran Sadeghi, Sydenham, both of England

[73] Assignee: BP Solar Limited, London, United Kingdom

[21] Appl. No.: 211,775

[22] PCT Filed: Oct. 15, 1992

[86] PCT No.: PCT/GB90/01888

§ 371 Date: Jul. 11, 1994

§ 102(e) Date: Jul. 11, 1994

[87] PCT Pub. No.: WO93/08594

PCT Pub. Date: Apr. 29, 1993

[30] Foreign Application Priority Data

Oct. 18, 1991 [GB] United Kingdom .................... 9122169

[51] Int. Cl.⁶ ...................................... C25C 1/22
[52] U.S. Cl. ......................... 204/86; 204/59 R; 205/162; 205/915
[58] Field of Search ............................. 205/50, 238, 252, 205/318, 162, 915; 204/86; 136/260

[56] References Cited

U.S. PATENT DOCUMENTS

| | | | |
|---|---|---|---|
| 4,192,721 | 3/1980 | Fawcett et al. | 204/86 |
| 4,388,483 | 6/1983 | Basol et al. | 136/260 |
| 4,400,244 | 8/1983 | Kroger et al. | 204/86 |
| 4,465,565 | 8/1984 | Zanio | 204/86 |
| 4,536,260 | 8/1985 | Cocivera | 204/238 |

FOREIGN PATENT DOCUMENTS

| | | |
|---|---|---|
| 244963 | 4/1987 | European Pat. Off. . |
| 60-140406 | 6/1985 | Japan . |
| 64-134192 | of 1989 | Japan . |
| 263353 | 5/1970 | U.S.S.R. . |

OTHER PUBLICATIONS

Morris et al., Towards High Efficiency Electrodeposited Cds/CdTe Thin Film Cells, Conference Record, 21st, IEEE, Photovoltaic Specialiots Conf. (May 1990), pp. 575–580.
Grot, Nafion as a Separator in Electrolytic Cells, The Electrochemical Society Meeting (May 7, 1986), pp. 1–7.
*Journal of the Electrochemical Society;* "Electrodeposition of Cadmium Telluride"; vol. 132, No. 11, pp. 2768–2771 (©Nov., 1985) (A. Darkowski et al.).
*Nafion® Product Bulletin;* "Nafion ®* as a Separator in Electrolytic cells"; Presented at The Electrochemical Society Meeting in Boston, Mass., on May 7, 1986 (W. G. F. Grot).
*Journal of the Electrochemical Society;* "Composition and Performance of Thin Film CdSe Electrodeposited from Selenosulfite Solution"; vol. 133, No. 6, pp. 1247–1252 (©Jun., 1986) (J. P. Szabo et al.).

*Primary Examiner*—Kathryn Gorgos
*Assistant Examiner*—Eana Wong
*Attorney, Agent, or Firm*—Fay, Sharpe, Beall, Fagan, Minnich & McKee

[57] ABSTRACT

Improved electrolytic deposition of semiconductors is obtained by separating the anode from the cathode by an ion-exchange membrane. The process is useful in the deposition of IIB/VIB semiconductors in the fabrication of photovoltaic cells.

20 Claims, No Drawings

ELECTROCHEMICAL PROCESS

The present invention relates to the production of chin film semiconductor materials by electrodeposition.

Thin film semiconductors are of value in the fabrication of photovoltaic cells. The production of semiconductor problems by electrodeposition gives rise to special problems. It is necessary to prepare materials of electronic grade purity, as very small quantities of impurity can have a large effect on the performance of devices made from the semiconductor material. The purity of the materials required is much higher than that for example needed in conventional metal plating.

One class of semiconductor materials which have been deposited by electrodeposition are the IIB/VIB semiconductor materials. Thus the production of thin film IIB/VIB semiconductors, e.g CdTe, by electrodeposition is disclosed by Panicker, Knaster, and Kroger, "Cathodic Deposition of CdTe from Aqueous Electrolytes", J. Electrochem. Soc. 124, No 4, April 1978 pp 556–572. Deposition of CdTe cakes place from an aqueous solution of $CdSO_4$ to which $TeO_2$ had been added and electrolysis was carried out using a nickel plate or glass places covered with semiconducting tin oxide-:antimony material on which the CdTe was deposited. Two anodes used were used together. One was a graphite rod and the other was a rod of Te.

The production of a CdTe layer by electrodeposition and its use in the fabrication of photovoltaic cells is disclosed in U.S. Pat. No. 4,425,194. Various arrangements of electrochemical cell are disclosed, for example one in which the anode is a tellurium bar and another in which the anode-is an inert carbon or stainless steel anode, or both a cadmium and a platinum anode, described as a neutral anode.

U.S. Pat. No. 4,548,681 discloses the electrodeposition of cadmium mercury telluride from aqueous solutions containing $Cd^{2+}$, $HTeO_2^+$ and $Hg^+$ ions. The principal anode is a Te anode but a graphite anode is also provided.

The common types of "inert", "neutral" or "non-consumable" anode are carbon anodes or are based on platinum, such as platinum metal or platinized titanium, e.g. titanium metal coated with platinum.

Although layers of II/VI semiconductor which can be used to make photovoltaic cells, such as CdTe, can be deposited when using such anodes we have found that the photovoltaic devices made from such thin films have impaired properties. For example devices suffer from low open circuit voltage ($V_{oc}$) and low fill factor (F.F.), and tend to have inconsistent and irreproducible behaviour.

We have found that in small scale production for short periods of time the purity of the materials used to make the electrolytic bath is of importance. However in larger scale production over prolonged periods of time we have found that the anode is a significant source of problems with semiconductor purity.

We have now found a method of depositing thin films of semiconductor electrolytically which enables improved material which can be used to make devices, e.g. photovoltaic cells of improved performance.

According to the present invention the process for the formation of a thin film of a semiconductor by a process which includes electrolytic deposition of material from a bath by passing current between an anode and a cathode is characterized in that the anode is separated from the bath from which the semiconductor is deposited by an ion-exchange membrane so as to give an anolyte compartment and a catholyte compartment.

The semiconductor is preferably a IIB/VIB semiconductor, i.e. a semiconductor containing at least one element from Group IIB and at least one element from Group VIB. In this specification references to IIB and VIB are references to the Periodic Table of the Elements as appearing in "Advanced Inorganic Chemistry" by Cotton & Wilkinson, 4th Edition, in which Group IIB includes Cd, and Group VIB includes Se and Te. The preferred semiconductors are compounds of Cd and Te, which may also contain Hg, as disclosed in U.S. Pat. No. 4,548,681. In addition to compounds of Cd,Te, and Hg it is also possible to use CdTe doped with small quantities of Cu, Ag, and Au as disclosed in U.S. Pat. No. 4,816,120 and U.S. Pat. No. 4,909,857. It is also possible to use CdTe containing chloride as described in U.S. Pat. No. 4,548,681 and U.S. Pat. No. 4,629,820.

Preferably the IIB/VIB semiconductor is deposited directly from the bath. However techniques of making IIB/VIB semiconductors are known in which alternate layers of say Cd and Te are deposited and the IIB/VIB semiconductor is formed after deposition of the layers by the application of energy, e.g. from a laser. The process of the present invention may be applied to the deposition of individual layers of elements which are subsequently combined to give a semiconductor layer or layers.

The present invention may also be applied to the electrodeposition of semiconductors such as copper indium diselenide. GaSb, GaAs, $Sn_{1+x}Se$, InSb, $CuInS_xSe_{2-x}$ have all been deposited by electrodeposition.

The cathode is conveniently formed from a semiconductor which forms part of a semiconductor device. e.g a photovoltaic cell, together with the electrodeposited layer. Thus the cathode may be a plate of transparent material, e.g. glass, covered with a transparent conducting layer, e.g. a layer of antimony tin oxide, in turn covered with a semiconconductor layer, e.g CdS.

The anode may be a consumable anode or a non-consumable electrode. Examples of non-consumable electrodes are carbon, platinum, or platinized titanium anodes. An example of a consumable anode is cadmium. Normally, cadmium anodes cannot be used because they become passivated by a layer of CdTe during the electrodeposition process. However the present invention makes possible their use by making possible the use of a non-passivating anolyte solution.

When using consumable or non-consumable anodes small amounts of impurities are liberated during the electrodeposition process. The use of an ion-exchange membrane prevents these impurities from reaching the electrodeposited material.

The bash in which the cathode is immersed (the catholyte) contains the ions which are deposited on the cathode to make the semiconductor. Suitable baths for this purpose are known. A suitable aqueous electrolyte for electrodeposition of CdTe would contain between about 0.1 M and 2 M CdSO4, 20–100 ppm Te, and 0–2000 ppm $Cl^-$. The pH of the electrolyte would be in the range 1.0–3.0.

The electrodeposition may be conveniently carried out over a range of temperatures for example 50° and 90° C.

The membrane is an ion-exchange membrane. Such membranes are known. When used to separate two liquids containing ions they allow ions to pass from one side of the membrane while preventing the passage of the liquids as a whole. A cation-exchange membrane allows cations to pass and an anion-exchange membrane allows anions to pass. Cation or anion-exchange membranes may be used in the process of the present invention although the use of cation-exchanged membranes is preferred.

Examples of suitable cation-exchange polymer membranes are those made from polymers containing perfluorosulphonic acid groups, such as the material sold by E I dupont de Nemours Inc under the trade name "Nafion" as a separator in electrochemical applications. This material is made by the copolymerization of a tetrafluoroethylene with a vinyl ether comonomer containing sulphonate groups.

The membrane divides the cell into an anolyte compartment and a catholyte compartment, preventing mixing of the solutions. The volume of the anolyte compartment may vary. In the case where the membrane is applied directly to the anode the volume will be negligible.

The known methods for making IIB/VIB semiconductors by cathodic electrodeposition in general place the cathode and the anode in the same bath. The present invention is based on the understanding that the known procedure can have an adverse effect on the nature of the semiconductor as shown by the properties of photovoltaic cells into which it is incorporated. In the process of the present invention the anode is separated from the catholyte by the membrane. It is not necessary for the anolyte to have the same composition as the catholyte. The optimum anolyte will depend on the nature of the anode. For Pt-containing anodes the anolyte can be for example a dilute aqueous solution of HCl, but a chloride-free anolyte such as dilute aqueous $H_2SO_4$ is preferable. For the preferred Cd anode the preferred anolyte is dilute aqueous HCl, as $H_2SO_4$ tends to passivate the anode.

A preferred form of the process comprises removing anolyte either at intervals or continuously from the anolyte compartment and replenishing the anolyte compartment with fresh anolyte. This helps to keep the concentration of any impurities released from the anode at a low level.

As indicated above the process of the present invention can be carried out using a cadmium anode. Alternatively the anode can be what is conventionally described as an "inert" electrode, i.e. one which is not consumed during the anodic process. However we have found that in known electrodeposition techniques the "inert" electrodes can interact in an undesirable way with the contents of the electrodeposition bath, with release of impurities into the bath. The present invention makes it possible to obtain satisfactory results with platinized titanium, iridium dioxide, and carbon anodes.

The improved quality of the semiconductor film is shown by the improved properties in devices prepared from it. The preparation of photovoltaic cells is disclosed in various published references. Thus such a cell may be obtained by depositing CdS on a transparent conducting substrate such as glass coated with tin oxide.(using electrodeposition, chemical bath or vacuum deposition), and then electrodepositing the IIB/VIB semiconductor on the CdS layer.

The IIB/VIB semiconductor may be heated to produce a change in conductivity type from n-type to p-type as disclosed in U.S. Pat. No. 4,388,483.

A conductive contact is deposited on the treated semiconductor surface. Techniques for depositing conductive contacts are well-known and there is therefore no need to describe these in detail. The conductive contact may for example be Nt, Cu, Au, multilayers of two or more metals (e.g. Cu/Au), carbon, or transparent conductive oxides, e.g. $SnO_2$ (TO) or $In_2O_3$:Sn (ITO).

The invention will now be described by reference to the following experiments in which experiments identified by number are Examples of the invention and experiments identified by letter are comparative tests not according to the invention.

Comparative Test A

This shows the results of using a carbon anode and no cation-exchange membrane.

A thin film of CdS was chemically deposited on a glass substrate coated with $SnO_2$ by immersing the glass substrate in a warm alkaline solution containing a cadmium complex ($[Cd(NH_3)_4]^{2+}$) and thiourea. The method is disclosed in N R Pavaskar, C A Menezes, A B P Sinha, J. Electrochemcial Soc. 124(1967) pp 743. The deposited film was rinsed with DIW (deionized water) and dried with nitrogen. The glass substrate with the deposited CdS layer was then heated at 400° C. in air for 10 minutes.

The glass substrate was immersed in glacial acetic acid as an etchant to remove surface layers on the CdS. In place of glacial acetic acid hydrazine hydrate would have been equally satisfactory.

A suitable electrodeposition arrangement is disclosed in U.S. Pat. No. 5,110,420.

The electrodeposition apparatus used comprised a plastics (e.g. polypropylene) vessel. The cathode was a glass plate coated with fluorine doped tin oxide, and then coated with a layer of CdS as described above. The anode was a carbon rod and was placed aligned parallel to the centre of the plate, at a distance of about 50 mm. Electrical contact is made to the edge of the cathode by conducting strips. A suitable electrical contact was cadmium metal strip coated with self-adhesive polyimide tape.

The electrodeposition conditions were as described in U.S. Pat. No. 4,400,244 and U.S. Pat. No. 4,456,630 except that the Te ions were added as $TeO_2$.

The bath electrolyte was an aqueous solution containing 0.5 M $Cd^{2+}$, 50 ppm Te, 300 ppm $Cl^-$, and pH about 1.7. Te ions were added by the addition of $TeO_2$ powder. The bath temperature was 70° C.

The electrode potential corrected for resistive losses was held at −0.5 volts relative to the Ag/AgCl reference electrode.

The bath was agitated during the electrodeposition of CdTe on the plate, which took place at a plating current density of about 0.14 mA/cm² The deposition continued for about 4.5 hours.

The glass substrate, now carrying CdS and CdTe layers, was then heat treated as disclosed in U.S. Pat. No. 4,388,483 to change the conductivity type of the CdTe from n-type to p-type. It was then etched as described in U.S. Pat. No. 4,456,630.

A back contact was then deposited by conventional techniques. A back metal contact consisting of gold dots (thickness 70 nm) each with an area of 2 mm2 was then evaporated on to the CdTe layer using conventional techniques (i.e. vacuum evaporation)

The gold dots formed individual photovoltaic cells on a common substrate and the performance of these individual cells was measured at room temperature, under an illumination of 100 mW cm using an ENH type quartz halogen light source with dichroic reflector. The average efficiencies and cell parameters of a number of such gold does was as follows: Voc of 0.69 V, 3sc of 19mA/cm², FF of 0.52 and an efficiency of 7%.

Comparative Test B

An experiment was carried out as in Test A, except chat the carbon anode was replaced by a 4 mm diameter platinized titanium rod. and the catholyte bath contained 0.82 M of $Cd^{2+}$, 49 ppm Te, 610 ppm $Cl^-$ and at a pH of 1.74.

Average values of photovoltaic cell characteristics were determined for a number of strips with 9 dots in each scrip. The results are shown in Table 1.

EXAMPLE 1

An experiment was carried out as in Test B except that the electrochemical cell was divided into two parts so as to separate the cathode and anode by a sheet of a cation-exchange membrane, available from E I dupont de Nemours Inc as "NAFION 324" membrane. The anolyte surrounding the anode was an aqueous solution of sulphuric acid with a pH of about 1.5.

The process of the invention leads to an increase in $V_{oc}$, $J_{sc}$, efficiency and fill factor.

EXAMPLE 2

An experiment was carried out as in Example 1 except that the anode was a rod of high purity Cd (99.99% Cd). The anolyte was aqueous HCl with a pH of about 1.5.

The $V_{oc}$ was 0.80 V, the $J_{sc}$ was 21 mA/cm$^2$, the FF was 0.72 and the efficiency was 13%.

Comparative Test C

An experiment was carried out as in Comparative Test A (i.e using a carbon electrode) and with a catholyte bath containing 0.43 M $Cd^{2+}$, 305 ppm $Cl^-$, and 34 ppm Te and a pH of 1.88.

Average values of photovoltaic cell characteristics were determined for a number of strips with 9 dots in each strip.

The results are shown in Table 2.

An experiment was carried out as in Example 1, with a platinized titanium anode, and a catholyte bath containing 0.80 M $Cd^{2+}$, 600 ppm $Cl^-$, and 50 ppm Te with a pH of 1.78, and a dilute $H_2SO_4$ anolyte with pH of about 1.6.

The results are shown in Table 3.

EXAMPLE 4

An experiment was carried out as in Example 2, with a Cd anode, a catholyte which contained 0.86 M $Cd^{2+}$, '636 ppm $Cl^-$, 50 ppm Te, pH 1.81., and an HCl anolyte with pH of 1.6. The results are shown in Table 4.

TABLE 1

| Strip | Voc mV | Jsc mA/cm$^2$ | Rs ohms | FF | Eff % |
|---|---|---|---|---|---|
| A | 667 | 20.40 | 294 | 0.55 | 7.5 |
| B | 698 | 24.1 | 216 | 0.59 | 10.0 |
| C | 673 | 21.7 | 271 | 0.54 | 7.9 |

In the above table Rs is sheet resistance and Eff is the % efficiency.

TABLE 2

| Strip | Voc mV | Jsc mA/cm$^2$ | Rs ohms | FF | Eff. % |
|---|---|---|---|---|---|
| A | 594 | 15.6 | 515 | 0.47 | 4.3 |
| B | 619 | 15.4 | 705 | 0.42 | 4.1 |
| C | 610 | 154 | 587 | 0.45 | 4.3 |
| D | 602 | 15.9 | 564 | 0.46 | 4.5 |
| E | 541 | 14.8 | 862 | 0.39 | 3.2 |

TABLE 3

| Strip | Voc mV | Jsc mA/cm$^2$ | Rs ohms | FF | Eff % |
|---|---|---|---|---|---|
| A | 770 | 21.8 | 198 | 0.68 | 11.4 |
| B | 766 | 20.3 | 242 | 0.65 | 10.2 |
| C | 761 | 20.5 | 206 | 0.67 | 10.4 |

TABLE 4

| Strip | Voc mV | Jsc mA./cm$^2$ | Rs ohms | FF | Eff % |
|---|---|---|---|---|---|
| A | 759 | 23.0 | 183 | 0.67 | 11.7 |
| B | 788 | 24.4 | 161 | 0.70 | 13.5 |
| C | 773 | 21.4 | 194 | 0.68 | 11.3 |

We have found as a result of our observations on the different cells than those according to the invention will show more consistent and reproducible behaviour in use. The catholyte life is greatly extended.

TABLE 4

| Strip | Voc mV | Jsc mA./cm$^2$ | Rs ohms | FF | Eff % |
|---|---|---|---|---|---|
| A | 759 | 23.0 | 183 | 0.67 | 11.7 |
| B | 788 | 24.4 | 161 | 0.70 | 13.5 |
| C | 773 | 21.4 | 194 | 0.68 | 11.3 |

We have found as a result of our observations on the different cells than those according to the invention will show more consistent and reproducible behaviour in use. The catholyte life is greatly extended.

We claim:

1. The process for the formation of a thin film of a semiconductor material which comprises electrolytic deposition of said material from a bath by passing current between an anode and a cathode wherein the bath is separated by an ion-exchange membrane into an anolyte compartment containing anolyte and the anode and a catholyte compartment containing the cathode and catholyte from which the semiconductor material is deposited.

2. The process according to claim 1 wherein the semiconductor is a IIB/VIB compound 3. The process according to claim 2 wherein the semiconductor is a compound containing Cd and To.

4. The process according to claim 1 wherein the semiconductor compound is electrolytically deposited on the cathode.

5. The process according to claim 4 wherein the anode is a consumable anode.

6. The process according to claim 5 wherein the anode is a cadmium anode.

7. The process according to claim 4 wherein the anode is a non-consumable anode.

8. The process according to claim 7 wherein the anode is a platinum or platinized titanium anode.

9. The process according to claim 1 wherein the cathode is a glass plate covered with a transparent conducting layer, in turn covered with a layer of CdS.

10. The process according to claim 1 wherein the ion-exchange membrane is a cation-exchange membrane.

11. The process according to claim 1 wherein the ion-exchange membrane is a polymer containing perfluorosulphonic acid groups.

12. The process according to claim 11 wherein the polymer is the product of copolymerizing of tetrafluoroethylene with a vinyl ether comonomer containing sulphonate groups.

13. The process according to any one of the preceding claims wherein the anolyte in the anolyte compartment and the catholyte in the catholyte compartments are of different compositions.

14. The process according to claim 13 wherein the anode is a non-consumable anode and the anolyte is dilute aqueous sulphuric acid.

15. The process according to claim 13 wherein the anode is a Cd anode and the anolyte is dilute aqueous HCl.

16. The process according to claim 1 wherein anolyte in the anolyte compartment is continuously removed during the electrodeposition process and replenished by fresh anolyte.

17. A process according to claim 3 wherein the semiconductor compound is electrolytically deposited on the cathode, which is a glass plate covered with a transparent conducting layer in turn covered with a layer of CdS, said cathode, which is in a catholyte in a catholyte compartment, being separated from said anode, which is an anode in an anolyte compartment, by a cation-exchange membrane, said anolyte and catholyte being of different composition.

18. A process according to claim 17 wherein the anolyte in the anolyte compartment is continuously removed during the electrodeposition process and replenished by fresh anolyte.

19. A process according to claim 7 wherein the anode is a cadmium anode.

20. A process according to claim 18 wherein the anode is a Cd anode and the anolyte is dilute aqueous HCl.

* * * * *